United States Patent
Arnaud

(10) Patent No.: US 10,431,597 B2
(45) Date of Patent: Oct. 1, 2019

(54) RF ELECTRONIC CIRCUIT COMPRISING CAVITIES BURIED UNDER RF ELECTRONIC COMPONENTS OF THE CIRCUIT

(71) Applicant: COMMISSARIAT A L'ENERGIE ATOMIQUE ET AUX ENERGIES ALTERNATIVES, Paris (FR)

(72) Inventor: Lucile Arnaud, Saint-Martin-D'Heres (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/487,865

(22) Filed: Apr. 14, 2017

(65) Prior Publication Data

US 2017/0301693 A1    Oct. 19, 2017

(30) Foreign Application Priority Data

Apr. 19, 2016  (FR) .................. 16 53449

(51) Int. Cl.
   *H01L 27/12*   (2006.01)
   *H01L 21/306*  (2006.01)
   *H01L 23/60*   (2006.01)
   *H01L 21/762*  (2006.01)

(52) U.S. Cl.
   CPC .... *H01L 27/1203* (2013.01); *H01L 21/30604* (2013.01); *H01L 21/76289* (2013.01); *H01L 23/60* (2013.01); *H01L 2224/05* (2013.01)

(58) Field of Classification Search
   CPC .............. H01L 23/60; H01L 21/30604; H01L 21/76283
   See application file for complete search history.

(56) References Cited

U.S. PATENT DOCUMENTS

| | | |
|---|---|---|
| 6,787,052 B1 | 9/2004 | Vaganov |
| 2010/0156510 A1 | 6/2010 | Botula et al. |
| 2011/0156284 A1* | 6/2011 | Zhang ............... H01L 22/34 257/797 |
| 2012/0075822 A1* | 3/2012 | Habibi .............. B32B 37/02 361/783 |

(Continued)

OTHER PUBLICATIONS

French Preliminary Search Report dated Dec. 6, 2016 in French Application 16 53449 filed on Apr. 19, 2016 (with English Translation of Categories of Cited Documents).

(Continued)

*Primary Examiner* — Changhyun Yi
(74) *Attorney, Agent, or Firm* — Oblon, McClelland, Maier & Neustadt, L.L.P.

(57) ABSTRACT

An RF electronic circuit comprising at least: a substrate comprising at least one support layer and a semiconducting surface layer located on the support layer; at least one electronic component able to carry out at least one of the RF signal transmission and/or reception and/or processing functions, and made in or on a first region of the surface layer; and a matrix of cavities located in at least one first region of the support layer located under the first region of the surface layer, facing at least the electronic component, and such that the internal volumes of the cavities are separated and isolated from each other by portions of the support layer.

19 Claims, 2 Drawing Sheets

(56) References Cited

U.S. PATENT DOCUMENTS

2014/0175598 A1* 6/2014 Li .................. H01L 29/0649
  257/507
2015/0145043 A1 5/2015 Huang et al.
2016/0284508 A1* 9/2016 Carson .............. H01J 37/3005

OTHER PUBLICATIONS

Michael Bauhuber, et al., "Isotropic wet chemical etching of deep channels with optical surface quality in silicon with HNA based etching solutions", Materials Science in Semiconductor Processing, 2013, 6 pgs.
Jean-Marc Le Meil, et al., "Engineered substrates: The foundation to meet current and future RF requirements", VLSI Technology, Systems and Application (VLSI-TSA), IEEE, 2015, 4 pgs.
Justine Philippe, et al., "Application-Oriented Performance of RF CMOS Technologies on Flexible Substrates", in Proc. of IEEE-IEDM, 2015, 4 pgs.
S.-W Tung, et al., "Fabricating Barbed Microtip Arrays by Low-Cost Silicon Wet Etching Techniques", IEEE Transducers, 2013, 4 pgs.

* cited by examiner ns of the RF part of the circuit. The invention is particularly applicable to the domain of RF applications, for example mobile telephony, in which it is useful to use RF electronic circuits made on SOI (silicon on insulator) substrates to minimise the cost and integration of these electronic circuits.

RF ELECTRONIC CIRCUIT COMPRISING CAVITIES BURIED UNDER RF ELECTRONIC COMPONENTS OF THE CIRCUIT

TECHNICAL DOMAIN AND PRIOR ART

The invention relates to an RF (Radio Frequency) electronic circuit comprising a matrix of buried cavities that improve the electrical performances of electronic components of the RF part of the circuit. The invention is particularly applicable to the domain of RF applications, for example mobile telephony, in which it is useful to use RF electronic circuits made on SOI (silicon on insulator) substrates to minimise the cost and integration of these electronic circuits.

In general, the electrical performances (particularly the linearity) of an RF electronic circuit made on an SOI substrate are limited by residual surface charges located at the interface between the Buried Oxide (BOX) layer and the solid layer or support layer, of silicon in the SOI substrate.

Different approaches have been disclosed to overcome these performance limitations, to reduce the electrical conductivity of the silicon support layer of the SOI substrate.

Document J-M. Le Meil et al., «Engineered substrates: The foundation to meet current and future RF requirements», VLSI Technology, Systems and Application (VLSI-TSA), 2015 International Symposium, Apr. 25-29, 2015, pp. 1-4, discloses how a polysilicon layer can be inserted between the silicon support layer and the buried dielectric layer of the SOI substrate so as to reduce the dynamics of charges at this interface. Such a layer of polysilicon can significantly reduce harmonic distortions in RF electronic circuits made from such a substrate.

Although such an SOI substrate comprising this polysilicon layer can give satisfactory electric performances, it is expensive to make.

The document by J. Philippe et al. entitled «Application-Oriented Performance of RF CMOS Technologies on Flexible Substrates», in Proc. of IEEE-IEDM 2015, pp. 406-409, discloses a process for replacement of the silicon support layer of the SOI substrate by another substrate. Such a process is called "Ultimate-Thinning-and-Transfer-Bonding" (UTTB).

However, this process has the disadvantage that it requires two transfers of the buried dielectric layer and parts forming the FEOL (Front-End-Of-Line), or Front End Part, and the BEOL (Back-End-Of-Line, or the Back-End part, of the circuit before the final structure is obtained.

The problem that arises due to the presence of residual surface charges at the interface between the buried oxide layer and the silicon support layer of an SOI substrate also occurs for other semiconductor on insulator type substrates, in other words comprising a dielectric layer intermediate between a support layer (that can comprise a semiconductor and/or one or several materials other than semiconductors) and a semiconducting surface layer, and also for substrates comprising a semiconducting surface layer in which one or several RF electronic components are made and placed on a support layer (for example a solid semiconducting layer) due to residual surface charges present in these substrates.

PRESENTATION OF THE INVENTION

Therefore there is a need to disclose an RF electronic circuit made in a substrate comprising at least one support layer and a semiconducting surface layer located on the support layer, for which the electrical performances and particularly the linearity are not limited or are only slightly limited by residual surface charges present in the substrate, and that does not have the disadvantages of solutions according to prior art described above, in other words that are inexpensive to make and that do not necessarily require a double transfer on different substrates to manufacture it.

Thus one embodiment proposes an RF electronic circuit comprising at least the following has been disclosed for this purpose:

- a substrate comprising at least one support layer and a semiconducting surface layer located on the support layer;
- at least one electronic component able to carry out at least one RF signal transmission and/or reception and/or processing function, and made in and/or on a first region of the surface layer;
- a matrix of cavities located in at least one first region of the support layer located under the first region of the surface layer, facing at least the electronic component, and such that the internal volumes of the cavities are separated and isolated from each other by portions of the support layer.

Thus, a structure is disclosed comprising a matrix of localised cavities buried in the substrate supporting the RF electronic component(s) and aligned underneath this or these electronic components. Thus, the cavities reduce the volume of material located under the RF electronic components) and increase the electrical resistance between the support layer and the electronic component(s), so that the electrical performances and particularly the linearity of this or these electronic components can be improved.

The presence of these cavities very much reduces or possibly eliminates the impact of residual surface charges present in the substrate.

Furthermore, due to the fact that portions of the support layer separate and isolate the cavities from each other, part of the material of the support layer is present under the electronic component(s) of the RF part of the circuit, so that the mechanical and thermal properties of the material making up the support layer, comprising for example silicon, can be maintained for the subsequent use and operation of the circuit.

Internal volumes of the cavities are separated and isolated from each other by portions of the support layer. The expression "isolated from each other" means that there is no communication between the internal volumes of the different cavities within the support layer, in other words a fluid cannot circulate from the internal volume of one of the cavities to the internal volume of another of the cavities within the support layer. In other words, there is a non-zero distance between the internal volumes of the cavities and they do not communicate with each other.

The support layer, also named thick layer or solid layer, forms the mechanical support for the substrate.

The semiconducting surface layer is also sometimes named the thin layer or the active layer of the substrate, particularly in the case of a semiconductor on insulator type structure such as an SOI substrate.

The RF electronic component may correspond to a component performing an elementary electronic function that can be treated like processing such as a switch, a Power Amplifier (PA), a coupler or a passive elementary component such as an inductance, etc.

One lateral dimension of each cavity may be greater than or equal to about 10 μm. This dimension is parallel to the interface between the support layer and the semiconducting surface layer. Such a dimension contributes to obtaining the best compromise between a reduction of the parasitic conductivity associated with the support layer and obtaining good thermal conduction and mechanical strength properties.

Advantageously, the substrate may be of the semiconductor on insulator type and it may also comprise a buried dielectric layer located between the surface layer and the support layer. In this case, the matrix of cavities reduces or eliminates the impact of residual surface charges located at the interface between the buried dielectric layer and the support layer on electrical performances and particularly the linearity of the electronic component(s).

The support layer may advantageously comprise at least one semiconductor, for example silicon. The buried dielectric layer may advantageously comprise oxide.

In a first configuration, the cavities may open up at a face of the buried dielectric layer such that said face of the buried dielectric layer forms a wall of each of the cavities. This first configuration is advantageous because creation of the cavities is facilitated by the fact that the buried dielectric layer can then act as an etching stop layer for production of the cavities.

In a second configuration, the thickness of a portion of the support layer arranged between the buried dielectric layer and the cavities may for example be between about 100 nm and 1 μm. The presence of this portion of the support layer between the cavities and the buried dielectric layer does not limit the effects created by the cavities on the increase of the electrical resistance between the support layer and the electronic component(s), the impact of residual surface charges present in the substrate remaining strongly limited or possibly eliminated. This also limits temperature rises and the mechanical behaviour of the device is improved.

The first region of the support layer may extend between or be included within, or even delimited by, a first plane parallel to an interface between the support layer and the buried dielectric layer and a second plane different from the first plane and parallel to the interface between the support layer and the buried dielectric layer.

A maximum lateral dimension of each of the cavities in each of the first and second planes may be approximately equal to the distance separating two neighboring cavities and/or be between about 10 μm and 40 μm. This maximum lateral dimension may for example correspond to a diameter if the cross-sections of the cavities are approximately circular, at least in the first and second planes.

When a maximum lateral dimension of each of the cavities is approximately equal to the distance separating two neighboring cavities, a conserved quantity of material in the support layer is approximately equal to the quantity of material that is removed from the support layer.

Furthermore, with a lateral dimension greater than or equal to about 10 μm, or between about 10 μm and 40 μm, the cavities are compatible with fluid circulation (gas or liquid) in these cavities to cool the RF electronic circuit, without adding any parasite electrical conduction. Such dimensions make the production of these cavities compatible with many manufacturing methods making use of etching.

For example, it is possible to make a cooling device capable of circulating at least one cooling fluid in the cavities and that is coupled to the RF electronic circuit. Such a cooling device may for example be a steam chamber.

It is possible that this maximum lateral dimension in these first and second planes is very small or almost zero, for example when the shape of the cavities is approximately spherical. This lateral dimension may be the dimension necessary to product the cavities.

A maximum lateral dimension of each of the cavities in a third plane parallel to the first and second planes and located between the first and the second planes may be greater than or equal to a maximum lateral dimension of each of the cavities in each of the first and second planes. Thus, the lateral dimensions of the cavities may not be constant over their entire height. Similarly, the shape of the section of the cavities may change over the height of the cavities. In particular, the shapes and dimensions of the cavities may be adapted as a function of the electrical performances required for the electronic components of the circuit and depending on the required thermal performances. Such a dimension contributes to obtaining the best compromise between a reduction of the parasite conductivity associated with the support layer and obtaining good thermal conduction and mechanical strength properties.

It is also possible that the lateral dimensions of the cavities are approximately constant over their entire height. For example, in the case of approximately cylindrical shaped cavities, the sections of each of the cavities in the first, second and third planes are approximately circular and the lateral dimensions of each are approximately the same.

In the first region of the support layer, the ratio between the volume of the cavities and the volume of the material in the support layer may be chosen by making a compromise between the electrical performances of electronic components of the circuit (these electrical performances improve as the volume occupied by the cavities in the first region of the support layer increases) and its thermal performances (the resistance of the components at high power improves as the volume of material under these components increases).

The thickness of the first region of the support layer may be between about 1 μm and 10 μm. This thickness may correspond to the height of the cavities. Such a thickness is suitable when the thickness of the support layer is equal to about 200 μm, or more generally between about 150 μm and 500 μm, or between about 150 μm and 775 μm, or even between about 500 μm and 775 μm.

The cavities may be extended in a second region of the support layer such that the first region of the support layer is located between the surface layer and the second region of the support layer. This extension may pass through a first face of the support layer opposite the second face of the support layer located on the side of the surface layer, for example in contact with the buried dielectric layer when the substrate comprises such a buried dielectric layer. In this configuration, the cavities and their extension may pass through the entire thickness or for example more than 50% of the thickness of the support layer.

The cavities may be filled with air and/or a material with a dielectric relative permittivity less than about 5 and/or a neutral gas. This can improve the electrical insulation between the material of the support layer and the electronic components of the RF part of the circuit. The material with dielectric relative permittivity less than about 5 can be porous.

The invention is also applicable to a method of making an RF electronic circuit comprising at least the following steps:
    make at least one electronic component capable of implementing at least one RF signal transmission and/or reception and/or processing function, in and/or on a first region of a semiconducting surface layer of a substrate also comprising at least one support layer on which the surface layer is located;

make a matrix of cavities located in at least one first region of the support layer located under the first region of the surface layer, at least facing the electronic component, and such that the internal volumes of the cavities are separated and isolated from each other by portions of the support layer.

One lateral dimension of each cavity may be greater than or equal to about 10 μm.

The making of the matrix of cavities may include etching of cavities through a first face of the support layer opposite a second face of the support layer on the same side as the surface layer, in the first region of the support layer and in a second region of the support layer. The advantage is that it avoids the need for a step to solidarize a second semiconducting layer for closing the cavities when the cavities are made by a thinning of the support layer for forming the first region and then an etching through the first region.

BRIEF DESCRIPTION OF THE DRAWINGS

This invention will be better understood after reading the description of example embodiments given purely for information and that are in no way limitative with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

Figure 1:
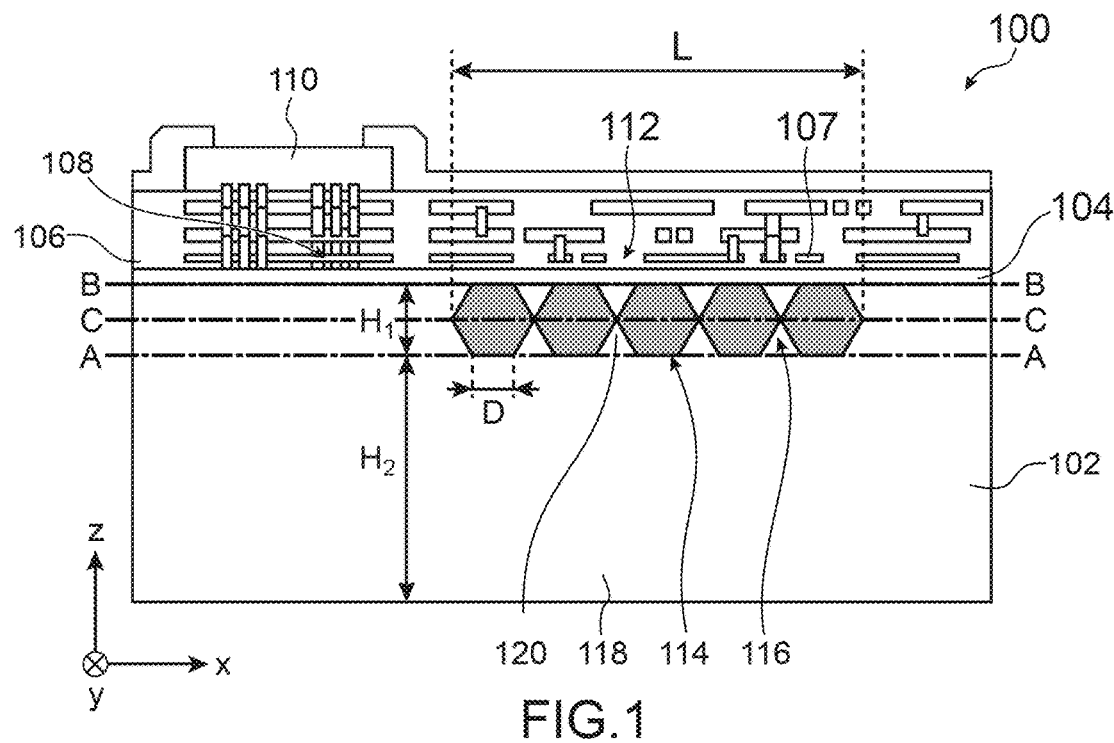
FIG. 1 shows a diagrammatic sectional view of a first embodiment of an RF electronic circuit.

Refer firstly to FIG. 1 that shows a diagrammatic sectional view of a first embodiment of an RF electronic circuit 100.

The circuit 100 is made from a semiconductor on insulator type substrate, for example an SOI substrate. This SOI substrate includes for example a support layer or a solid layer 102, for example comprising a semiconductor and advantageously silicon, on which a buried dielectric or BOX layer 104 is arranged, for example comprising $SiO_2$. A semiconducting surface layer 106, for example including silicon in this case, is arranged on the buried dielectric layer 104.

The thickness of the support layer 102 may for example be between about 500 μm and 775 μm, particularly when the SOI substrate corresponds to a wafer with a diameter equal to 300 mm, or more generally between about 150 μm and 775 μm. For example, the surface layer 106 may be between about 50 nm and 150 nm thick.

The circuit 100 comprises electronic components 107 made on/or in the surface layer 106, forming the Front-End (FEOL) part of the circuit 100.

The circuit 100 also comprises conducting and dielectric layers arranged alternately on the Front-End part of the circuit 100 and forming the Back-End of BEOL part 108 of the circuit 100. These conducting and dielectric layers form electrical connections within the circuit 100, between the electronic components 107, and one or several electrical accesses 110 to connect the circuit 100 to elements external to the circuit 100.

At least some of the components among all these electronic components 107 form an RF part of the circuit 100. These electronic components forming the RF part of the circuit 100 are capable in particular of implementing at least one RF signal transmission and/or reception and/or processing function, for example signal conversions between the base band and the RF frequencies band. These electronic components 107 forming the RF part of the circuit 100 correspond for example to LDMOS transistors, RF switches, inductances, etc. These electronic components of the RF part of the circuit 100 are made in and/or on a first region 112 of the surface layer 106.

The circuit 100 also comprises a matrix of cavities 114 located in a first region 116 of the support layer 102 located on the same side as the buried dielectric layer 104 (this first region 116 of the support layer 102 is in contact with the buried dielectric layer 104). The thickness of this first region 116 is $H_1$, while the thickness of the remaining part of the support layer 102 is $H_2$. If the total thickness of the support layer 102 is equal to for example about 200 μm, then $H_1 + H_2 = 200$ μm.

The value of the thickness $H_1$ is defined as a function of the required RF performances for the electronic components forming the RF part of the circuit 100 and that are located in and/or on the first region 112 of the surface layer 106. As the height of the cavities 114 increases (in this case equal to the thickness $H_1$), the electrical insulation between the semiconductor of the support layer 12 and the electronic components 107 of the RF part of the circuit 100 improves. Advantageously, the thickness $H_1$ is such that 1 μm≤$H_1$≤μm.

In the first embodiment described with reference to FIG. 1, the cavities 114 are located entirely in the first region 116. Therefore a second region 118 of the support layer 102 located under this first region 116 comprises only the semiconductor of the support layer 102.

The first region 116 of the support layer 102 in which the cavities 114 are formed extends between a first plane parallel to an interface between the support layer 102 and the buried dielectric layer 104, referenced AA on FIG. 1, and a second plane also parallel to the interface between the support layer 102 and the buried dielectric layer 104, referenced BB on FIG. 1.

Plane AA is the plane in which the bottom walls of the cavities 114 are formed. This plane AA is located at the interface between the first region 116 of the support layer 102 and the second region 118 of the support layer 102.

Plane BB is the plane in which the top walls of the cavities 114 are formed. This plane BB is located at the interface between the buried dielectric region 104 and the support layer 102.

In the first embodiment, the cavities 114 open up at the bottom face of the buried dielectric layer 104 that forms the top walls of the cavities 114. Thus, the cavities 114 pass through the top face of the support layer 102.

Moreover, in this first embodiment, the cavities 114 are hermetically closed.

In the first embodiment described herein, the shape and the dimensions of the sections of the cavities 114 parallel to the principal plane of the SOI substrate (the principal plane of the SOI substrate is the horizontal plane parallel to the interface between the support layer 102 and the buried dielectric layer 104 or to the interface between the buried dielectric layer 104 and the surface layer 106 and that, on FIG. 1, corresponds to the (X,Y) plane) are not constant along the thickness $H_1$ of the first region 116 of the support layer 102.

Figure 2:
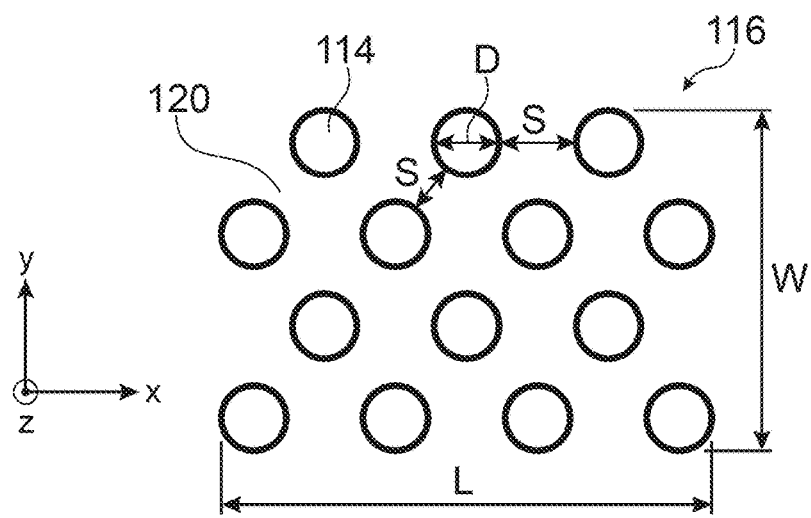
FIGS. 2 and 3 diagrammatically show sectional views of cavities made in the substrate of a first embodiment of an RF electronic circuit.

FIG. 2 shows a sectional view of the first region 116 of the support layer 102 in plane AA that corresponds to the plane parallel to the principal plane of the SOI substrate, passing in the support layer 102 and located at a distance equal to about $H_1$ from the interface between the support layer 102 and the buried dielectric layer 104.

As shown on FIG. 2, the cavities 114 are laid out parallel to the principal plane of the SOI substrate, staggered from each other such that the cavities 114 are arranged one next to each other and forming a regular matrix of cavities 114. The cavities 114 in this case form a matrix in the principal plane of the SOI substrate, with width W and length L (corresponding to the dimensions of the first region 116 of the support layer 102), thus occupying an area similar to the area of the first region 112 in which the electronic components forming the RF part of the circuit 100 are made. Although the dimensions L and W are chosen as a function of the space occupied by the electronic components 107 of the RF part of the circuit 100, the length L is advantageously greater than or equal to about 100 µm and the width W is advantageously less than or equal to about 400 µm.

Moreover, in the first embodiment described herein, the section of each of the cavities in plane AA and in plane BB are approximately circular and their diameter is D. Furthermore, each cavity 114 in planes AA and BB is at a distance S from the adjacent cavities 114.

For example, the value of D is approximately the same as the value of S, which means that a lateral dimension or a maximum lateral dimension of each of the cavities 114 in the planes AA and BB is approximately equal to a distance separating two neighboring cavities. Furthermore, the value of D may for example be between about 10 µm and 40 µm.

Figure 3:
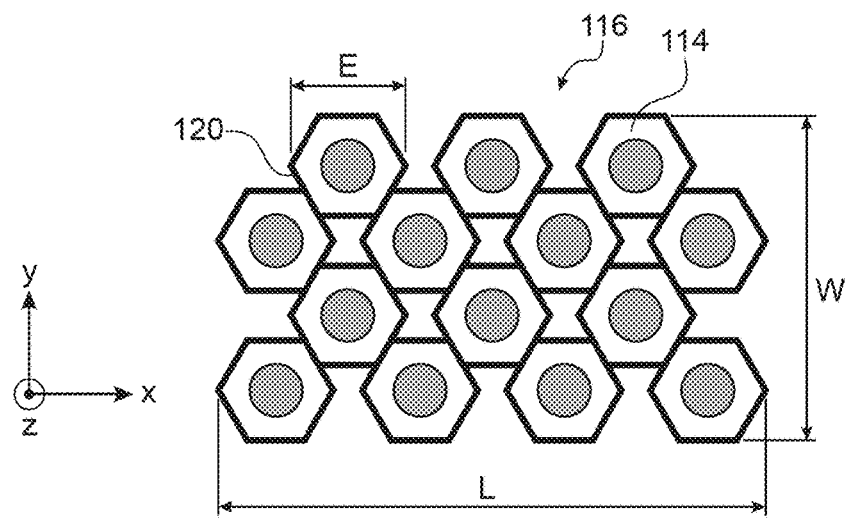

FIG. 3 shows a sectional view of the first region 116 of the support layer 102 in plane CC that corresponds to the plane parallel to the principal plane of the SOI substrate and located at a distance equal to about $H_1/2$ from each of the planes AA and BB. Therefore the plane CC corresponds to the plane passing at the mid-height of the cavities 114.

As already mentioned, the dimensions and shape of the section of the cavities 114 vary along their height. In the first embodiment described herein, the section in the plane CC of each of the cavities 114 is approximately hexagonal in shape with width E, in other words comprising six sides each with a length equal to E/2. The value of E in this case is such that D<E<(D+S).

The values of the dimensions D and E are chosen particularly as a function of the value of $H_1$, such that for the entire matrix of cavities 114, a sufficient volume of the semiconductor of the support layer 102, even if it is slightly electrically conducting, is replaced by a medium that is a better electrical insulator than the semiconductor of the support layer 102. The cavities 114 are made such that they have good electrical insulation, in other words a high electrical resistance, and a low electrical capacitance. To achieve this, the internal volumes of the cavities 114 can be filled with air and/or a neutral gas. It is also possible that the internal volumes of the cavities 114 are filled with a material with low relative dielectric permittivity, for example less than about 5. For example, the cavities 114 can be filled with a polymer and/or an oxide, possibly porous.

The internal volumes of the cavities 114 are separated from and are isolated from each other by portions 120 of the first region 116 of the support layer 102, over the entire thickness $H_1$ of the first region 116.

In the first embodiment described above, the cavities 114 open up on one face of the buried dielectric layer 104, in other words they pass through the face of the support layer 102 located on the same side as the buried dielectric layer 104. As a variant, it is possible that the cavities 114 do not pass through this face of the support layer 102 and therefore that a portion of the support layer 102 is located between the buried dielectric layer 104 and the matrix of cavities 114, or between the buried dielectric layer 104 and the first region 116 of the support layer 102. The thickness of this portion of the support layer 102 can be between about 100 µm and 1 µm.

To make the circuit 100 described above with reference to FIG. 1, the electronic components 107 are firstly made on and/or in the surface layer 106, thus forming the FEOL of the circuit 100. The BEOL 108 of the circuit 100 is then made.

The support layer 102 is then thinned from its back face so as to keep a semiconducting layer with a thickness equal to the thickness $H_1$ of the first region 116. Before this thinning, when the remaining layer with the required thickness $H_1$ does not give sufficient mechanical support, it is possible to firstly glue a temporary substrate, for example comprising glass, in contact with the front part of the circuit 100, in other words on the BEOL 108 of the circuit 100, so as to make it easier to manipulate the assembly while this thinning is being done and after thinning. Such a transfer of a temporary substrate can be judicious when the thickness of the support layer 102 is less than about 250 µm.

Lithography and etching steps are then applied to form the matrix of cavities 114 in the first region 116. Different shapes of cavities can be obtained depending on the etching method used and the required dimensions D, E and $H_1$, for example as described in the documents entitled 'Isotropic wet chemical etching of deep channels with optical surface quality in silicon with HNA based etching solutions" by M. Bauhuber et al., Materials Science in Semiconductor Processing 16, 2013, pages 1428-1433, and "Fabricating barbed microtip arrays by low-cost silicon wet etching techniques" by S.-W. Tung et al., IEEE Transducers 2013, Barcelona, Spain, Jun. 16-20, 2013, pages 1028-1031.

The method is completed by bonding (for example "direct bonding") another semiconducting layer in contact with the layer in which the cavities 114 have been etched, so as to close the cavities 114. This bonding enables to make a support layer similar or close to the initial support layer (except the cavities 114). The temporary substrate is then removed to obtain a macroscopic configuration of the wafer similar to the initial configuration. Subsequent packaging steps can then be implemented.

As a variant to the first embodiment described above, the shapes of the different sections of the cavities 114 may be different from those described above. The dimensions may also be different from the dimensions described above. Moreover, the cavities 114 may be such that the section and/or the lateral dimensions of the cavities are approximately constant along the height of the cavities 114 (which for example means that the shape of the section of the cavities 114 and/or the lateral dimensions of the cavities can be similar in the planes AA, BB and CC).

Figure 4:
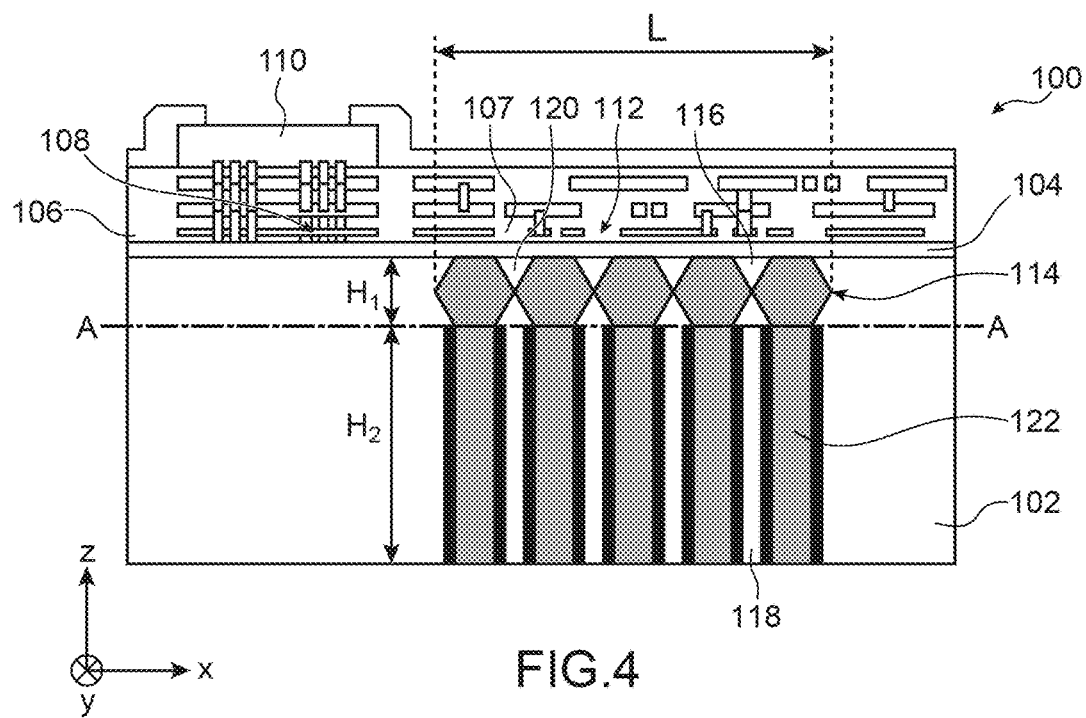
FIG. 4 shows a diagrammatic sectional view of a second embodiment of an RF electronic circuit.

FIG. 4 shows a diagrammatic view of the second embodiment of an RF electronic circuit 100.

Like the circuit 100 previously described with reference to FIGS. 1 to 3, the circuit 100 according to this second embodiment is made from an SOI substrate comprising the support layer 102, the buried dielectric layer 104 and the semiconducting surface layer 106. The circuit 100 also comprises the electronic components 107 (Front-End part), the BEOL 108, and the matrix of cavities 114 that, in the first region 116 of the support layer 102, are similar to those described above with reference to the first embodiment.

In this second embodiment, the cavities 114 are extended in the second region 118 of the support layer 102. In the example described herein, the extension of the cavities 114 is made throughout the thickness $H_2$ of the second region 118. As a variant, it is possible that this extension of the cavities 114 is made only in part of the thickness $H_2$ of the second region 118 (which implies that the semiconductor is present under these extension parts).

On FIG. 4, this extension of the cavities 114 forms cylindrical shaped parts 122, in other words each with a circular shaped section in the (X, Y) plane with diameter D, as for cavities 114 in plane AA.

Advantageously, the height H of these parts 122 depends on the value of D, particularly such that the value of the height H is equal to approximately 10*D.

As described above, the cavities 114 and the parts 122 can be empty, or they can be filled with air and/or a neutral gas. Advantageously, they can be covered entirely or on the side walls only, with a material that is a good thermal conductor (for example a metal such as Cu, W, etc.).

The step of bonding with the temporary substrate can be eliminated when making the circuit 100 according to this second embodiment.

The cavities 114 and the parts 122 are made with several etching steps. For example, in a first step, an anisotropic etching is implemented over the entire thickness $H_2$ of the second region 118 of the support layer 102, thus forming the parts 122. For example, this first etching corresponds to a dry reactive ion etching like that used to etch TSVs.

A protection layer is then deposited for example corresponding to a PVD deposition of $SiO_2$ over a thickness of about 200 nm, within the parts 122, on the lateral walls of these parts. The oxide thus deposited will also be etched at the bottom of the cavities 114 to enable the last etching step of the semiconductor forming the cavities 114. This is preferably done by an isotropic method so as to obtain parts of cavities 114 with hexagonal sections. It may be advantageous to make this isotropic etching using a liquid solution using a liquid solution combining the HF, $HNO_3$, $H_2SO_4$ and $H_3PO_4$ elements that have good selectivity relative to $SiO_2$, deposited on the side faces of the parts 122 and also of the buried dielectric layer 104. It will be noted that the latter chemistry can be dispensed either in the liquid phase or gas phase.

As a variant to the two embodiments described above, the shapes of the sections of the cavities 114 may be different from those described above, in other words different than circular or hexagonal. The dimensions may also be different from the dimensions described above. Moreover, the cavities 114 may be such that the section and/or the lateral dimensions of the cavities are approximately constant along the height of the cavities 114 (which for example means that the shape of the section of the cavities 114 and/or the lateral dimensions of the cavities can be similar in the planes AA, BB and CC), that can be obtained by anisotropic etching.

In all the embodiments, the shape and the volume of the cavities 122 are adjusted as a function of a compromise to be made between either minimising the volume of semiconductor between the cavities 122 and then giving priority to the electrical performances of the electronic parts 107 of the RF part of the circuit 100, or keeping a larger volume of semiconductor and giving priority to thermal performances, in other words to obtain a better resistance of components 107 at high power.

In the embodiments described above, the substrate corresponds to a semiconductor on insulator type substrate in which the support layer 102 comprises the semiconductor. As a variant, the support layer 102 may comprise at least one material that is not a semiconductor.

It is also possible that the substrate used is not a semiconductor on insulator type substrate. For example, it is possible that the semiconducting surface layer 106 is located directly on the support layer 102, without the presence of a buried dielectric layer between the surface layer 106 and the support layer 102. In this case, it is possible that the first region 116 of the support layer 102 in which the cavities 114 are made would be located in contact with the surface layer 106 if a part of the support layer 102 is not kept between the cavities 114 and the first region 112 of the surface layer 106.

The invention claimed is:

1. An RF electronic circuit comprising:
   a single unitary substrate comprising at least one support layer and a semiconducting surface layer located on the support layer;
   at least one electronic component able to carry out at least one of an RF signal transmission and/or reception and/or processing functions, and made in or on a first region of the semiconducting surface layer; and
   a matrix of cavities located in at least one first region of the support layer located under the first region of the semiconducting surface layer and not in the semiconducting surface layer, facing at least the electronic component, and such that internal volumes of the cavities are separated and isolated from each other by portions of the support layer,
   wherein one lateral dimension of each said cavity is greater than or equal to about 10 μm, and
   wherein the cavities are aligned underneath said at least one electronic component.

2. The RF electronic circuit according to claim 1, wherein the substrate is a semiconductor on insulator configuration and also comprises a buried dielectric layer located between the semiconducting surface layer and the support layer.

3. The RF electronic circuit according to claim 2, wherein the cavities open up at a face of the buried dielectric layer such that said face of the buried dielectric layer forms a wall of each of the cavities.

4. The RF electronic circuit according to claim 2, wherein a thickness of a portion of the support layer between the buried dielectric layer and the cavities is between about 100 nm and 1 μm.

5. The RF electronic circuit according to claim 2, wherein the first region of the support layer extends between a first plane parallel to an interface between the support layer and the buried dielectric layer and a second plane different from the first plane and parallel to the interface between the support layer and the buried dielectric layer.

6. The RF electronic circuit according to claim 5, wherein a maximum lateral dimension of each of the cavities in each of the first and second planes is approximately equal to a distance separating two neighboring cavities and/or is between about 10 μm and 40 μm.

7. The RF electronic circuit according to claim 5, wherein a shape of a section of each of the cavities in each of the first and second planes is approximately circular or hexagonal.

8. The RF electronic circuit according to claim 5, wherein a maximum lateral dimension of each of the cavities in a third plane parallel to the first and second planes and located between the first and the second planes is greater than or equal to a maximum lateral dimension of each of the cavities in each of the first and second planes.

9. The RF electronic circuit according to claim 8, wherein a section through each of the cavities in the third plane is approximately circular or hexagonal.

10. The RF electronic circuit according to claim 1, wherein a thickness of the first region of the support layer is between about 1 µm and 10 µm.

11. The RF electronic circuit according to claim 1, wherein the cavities are extended in a second region of the support layer such that the first region of the support layer is located between the semiconducting surface layer and the second region of the support layer.

12. The RF electronic circuit according to claim 1, wherein the cavities are hermetically closed.

13. The RF electronic circuit according to claim 1, wherein the cavities are filled with at least one of the following elements: air, a material with a relative dielectric permittivity of less than about 5, or a neutral gas.

14. The RF electronic circuit according to claim 1, wherein each of the cavities is unexposed at opposite ends, a bottom end being closed by the support layer.

15. The RF electronic circuit according to claim 1, wherein, top ends of the cavities are spaced from the semiconducting surface layer.

16. A method of making an RF electronic circuit comprising:
    making at least one electronic component capable of implementing at least one of an RF signal transmission and/or reception and/or processing functions, in a first region of a semiconducting surface layer of a single unitary substrate also comprising at least one support layer on which the semiconducting surface layer is located; and
    making a matrix of cavities located in at least one first region of the support layer located under the first region of the semiconducting surface layer and not in the semiconducting surface layer, facing at least the at least one electronic component, and such that internal volumes of the cavities are separated and isolated from each other by portions of the support layer, and such that a lateral dimension of each of the cavities is greater than or equal to about 10 µm,
    wherein the cavities are aligned underneath said at least one electronic component.

17. The method according to claim 16, wherein said making the matrix of cavities includes:
    thinning of the support layer such that a remaining thickness of the support layer forms a layer with the same thickness as the first region of the support layer;
    etching cavities in the first region of the support layer; and
    solidarizing a second layer in contact with said layer with the same thickness as the first region of the support layer, this second layer closing the cavities on the side opposite the side on which the surface layer is located.

18. The method according to claim 16, wherein said making the matrix of cavities includes etching of cavities through a first face of the support layer opposite a second face of the support layer on the same side as the surface layer, in the first region of the support layer and in a second region of the support layer.

19. The method according to claim 16,
    wherein the substrate comprises a buried dielectric layer located between the semiconducting surface layer and the support layer, and
    wherein the cavities open up at a face of the buried dielectric layer such that said face of the buried dielectric layer forms a wall of each of the cavities.

* * * * *